United States Patent
Sugawara et al.

(10) Patent No.: US 7,560,396 B2
(45) Date of Patent: Jul. 14, 2009

(54) MATERIAL FOR ELECTRONIC DEVICE AND PROCESS FOR PRODUCING THE SAME

(75) Inventors: Takuya Sugawara, Nirasaki (JP); Shigenori Ozaki, Amagasaki (JP); Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 247 days.

(21) Appl. No.: 10/509,662

(22) PCT Filed: Mar. 31, 2003

(86) PCT No.: PCT/JP03/04126
§ 371 (c)(1),
(2), (4) Date: Aug. 22, 2005

(87) PCT Pub. No.: WO03/088345
PCT Pub. Date: Oct. 23, 2003

(65) Prior Publication Data
US 2006/0046503 A1    Mar. 2, 2006

(30) Foreign Application Priority Data
Mar. 29, 2002  (JP) .............................. 2002-097871

(51) Int. Cl.
H01L 21/31    (2006.01)
(52) U.S. Cl. ...................... 438/786; 438/287; 438/585; 438/777; 257/E21.302; 257/E21.625
(58) Field of Classification Search .................. 438/776, 438/777, 513; 257/E21.302
See application file for complete search history.

(56) References Cited

U.S. PATENT DOCUMENTS

| | | | |
|---|---|---|---|
| 6,110,842 A | | 8/2000 | Okuno et al. |
| 6,136,654 A | * | 10/2000 | Kraft et al. .................. 438/287 |
| 6,450,116 B1 | | 9/2002 | Noble et al. |
| 2002/0002948 A1 | | 1/2002 | Hongo et al. |

(Continued)

FOREIGN PATENT DOCUMENTS

EP    0 847 079 A2    6/1998

(Continued)

OTHER PUBLICATIONS

Hattangady, S. V. et al., "Controlled nitrogen incorporation at the gate oxide surface", Appl. Phys. Lett., Jun. 19, 1995, vol. 66, No. 25, American Institute of Physics.

(Continued)

Primary Examiner—Walter L Lindsay, Jr.
Assistant Examiner—Cheung Lee
(74) Attorney, Agent, or Firm—Crowell & Moring LLP

(57) ABSTRACT

An electronic device material comprising at least an electronic device substrate and a silicon oxynitride film disposed on the substrate is provided. The silicon oxynitride film is characterized by containing nitrogen atoms in a large amount in the vicinity of the oxynitride film surface when the nitrogen content distribution in the thickness direction of the silicon oxynitride film is examined by SIMS (secondary ion mass spectrometry) analysis. By virtue of this constitution, an electronic device material comprising an oxynitride film having an excellent effect of preventing penetration of boron and having excellent gate leak properties can be obtained.

8 Claims, 16 Drawing Sheets

U.S. PATENT DOCUMENTS

| | | |
|---|---|---|
| 2002/0020498 A1 | 2/2002 | Ohmi et al. |
| 2002/0096721 A1 | 7/2002 | Mogami et al. |
| 2002/0111000 A1 | 8/2002 | Kawakami et al. |
| 2004/0042307 A1 | 3/2004 | Ohmi et al. |

FOREIGN PATENT DOCUMENTS

| | | | |
|---|---|---|---|
| JP | 10-173187 A | | 6/1998 |
| JP | 11-111620 A | | 4/1999 |
| JP | 2000-294550 A | | 10/2000 |
| JP | 2000294550 A | * | 10/2000 |
| JP | 2000-332009 A | | 11/2000 |
| JP | 2001-274148 A | | 10/2001 |
| JP | 2001-274151 A | | 10/2001 |
| JP | 2001-338918 A | | 12/2001 |
| JP | 2002-170825 A | | 6/2002 |
| JP | 2002-222941 A | | 8/2002 |
| JP | 2002-261097 A | | 9/2002 |
| JP | 2003-163213 A | | 6/2003 |
| JP | 2003-282567 A | | 10/2003 |
| WO | WO 00/65631 A2 | | 11/2000 |
| WO | WO 02/054474 A1 | | 7/2002 |

OTHER PUBLICATIONS

Corresponding International Preliminary Examination Report (Form PCT/IPEA/409) dated May 7, 2004, along with Form PCT/IB/338 (Five (5) pages).

Corresponding International Search Report (Form PCT/ISA/210) dated Jul. 1, 2003 (Two (2) pages).

Corresponding Japanese Office Action dated Apr. 3, 2007 (Five (5) pages).

Corresponding Japanese Office Action dated Oct. 16, 2007 (Four (4) pages).

* cited by examiner

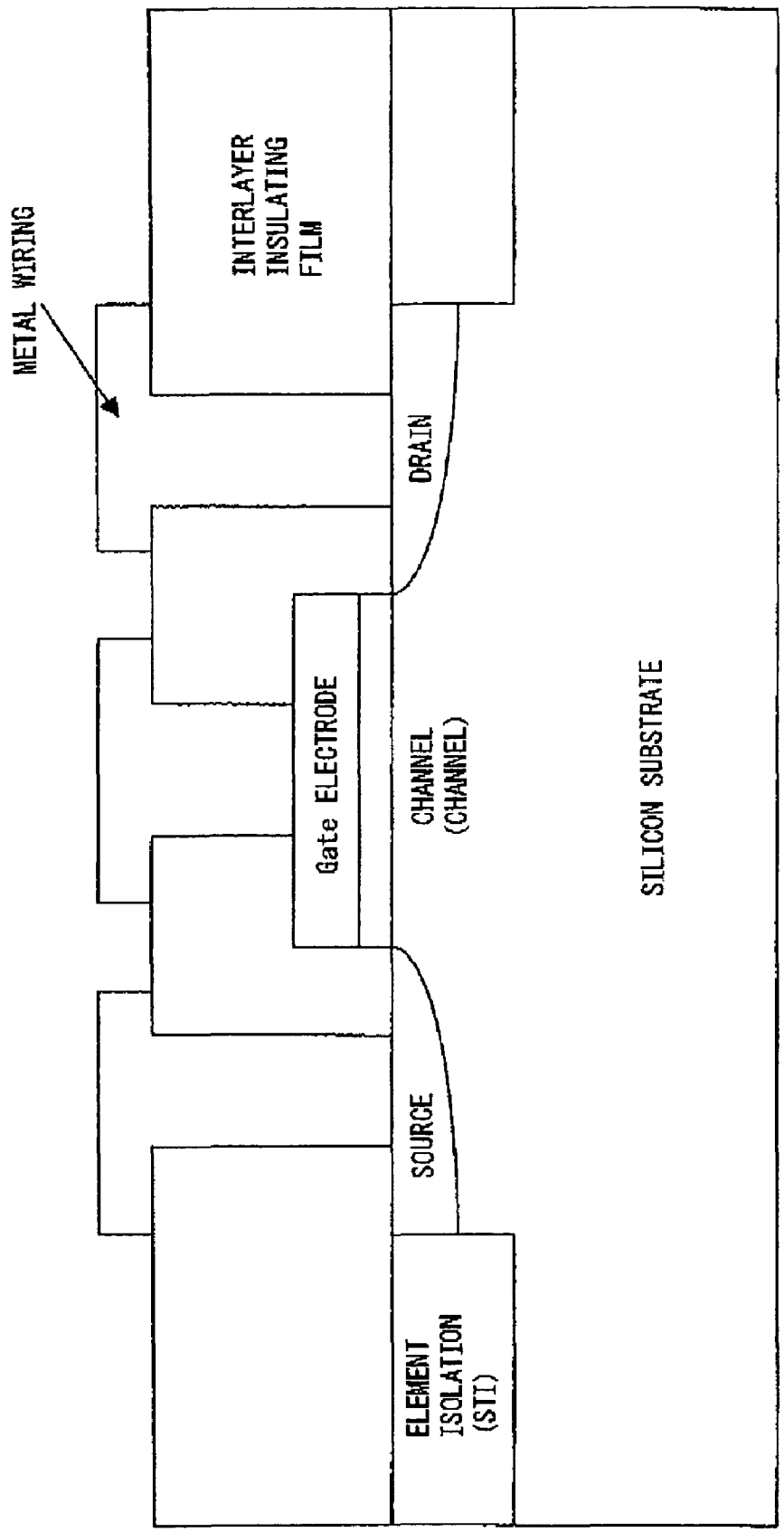

SPA PLASMA TREATMENT

MATERIAL FOR ELECTRONIC DEVICE AND PROCESS FOR PRODUCING THE SAME

TECHNICAL FIELD

The present invention relates to an electronic device material having an oxynitride film excellent in various properties (for example, barrier property to boron), and a production process thereof. The electronic device material and its production process of the present invention can be suitably used, for example, for forming a material for semiconductors or semiconductor devices (for example, those having an MOS-type transistor structure with a gate insulating film having excellent properties).

BACKGROUND ART

The present invention is widely applicable to the production in general of a material for semiconductors or electronic devices such as semiconductor device and liquid crystal device, but for the sake of convenience, the background art of semiconductor devices is described here as an example.

With recent miniaturization of semiconductor devices, needs for a thin and good-quality silicon oxide film ($SiO_2$ film) are significantly increasing. For example, in an MOS-type transistor structure (FIG. 1) which is a most popular constitution of semiconductor devices, a very thin (for example, about 2.5 nm or less) and good-quality gate insulating film ($SiO_2$ film) according to the so-called scaling rule is keenly demanded.

The gate insulating film material heretofore used in industry is a silicon oxide film ($SiO_2$ film) obtained by directly oxidizing a silicon substrate in a high-temperature heating furnace of approximately from 850 to 1,000° C.

However, if such an $SiO_2$ film is merely made thin to 2.5 nm or less, the leak current passing through the gate insulating film (gate leak current) becomes large and this causes problems such as increase of power consumption or accelerated deterioration of device properties.

Furthermore, in using a conventional thin gate insulating film, boron contained in a gate electrode (mainly polysilicon) of a P-type MOS transistor penetrates into the $SiO_2$ film at the formation of the gate electrode and the boron concentration of the gate electrode changes to cause a problem that the semiconductor device properties deteriorate. As one of the methods for solving such problems, studies are being made to use an oxynitride film (acid nitride film) as the gate insulating film material.

When nitrogen is contained in the insulating film, this is advantageous in that the dielectric constant of the film is elevated and the electrical capacitance (capacitance) increases as compared with an oxide film having the same physical film thickness. The MOS-type transistor, which can be typically represented by the structure shown in FIG. 1 described later, contains an MOS (metal-oxide-semiconductor) capacitor structure using a gate insulating film as the dielectric material, between two metals (doped polysilicon (gate electrode) and silicon substrate).

In order to attain high-speed transistor operation, the time required for a carrier to move between the source and the drain shown in FIG. 1 must be shortened. The measure therefor includes two approaches, that is, a method of increasing the speed (mobility) of the carrier moving between the source and the drain, and a method of reducing the distance between the source and the drain. At present, the control of the interface between the silicon substrate and the oxide film reaches the limit and the mobility can be hardly increased any more.

Accordingly, the method of reducing the channel length in the MOS structure of FIG. 1 is used at present for achieving high-speed operation of transistor. As this channel length is shorter, the time required for a carrier to move becomes shorter and a transistor operation at a higher speed can be realized. However, the reduction of the channel length has the same meaning as the reduction in the area of MOS capacitor contained in that portion, namely, reduction in the capacitance, and this gives rise to an insufficient amount of carrier (electron or hole) induced at the operation and in turn, difficulty in obtaining an S/N ratio high enough to bring about the operation. Accordingly, in order to realize a device having high-speed operation reliability, a measure must be taken to maintain the capacitance even when the area is decreased.

As the measure therefor, a method of decreasing the film thickness of the gate insulating film of FIG. 1 has been conventionally employed, but the thinning of the film incurs the following problems. One problem is that a current (leak current) flows between the silicon substrate (channel) and the gate electrode due to quantum mechanical tunnel effect and the power consumption increases. A low power consumption device is essential for the development of portable electronic devices in a recently started ubiquitous society (information society allowing for connection to the network at any time and any place through an electronic device as the medium), and reduction of this leak current is an important problem.

Also, with the thinning of the gate oxide film, as described above, the penetration of boron from the gate electrode of a P-type MOS transistor comes out as a serious problem. Boron has a property of readily passing through an oxide film and as the film is more thinned, this causes a problem that boron penetrates the oxide film and the boron concentration (dope amount) of the gate electrode changes. A CMOS structure (mixed-mounting of N-type and P-type transistors) is fundamental for low power consumption devices and accordingly, the presence of a P-type MOS transistor is indispensable. The change in the dope amount of the gate electrode causes change in the threshold voltage of the transistor and the transistor may undergo irregular operation. Therefore, it is very important to prevent the penetration of boron.

In order to solve these problems, as described above, a method of incorporating nitrogen into the silicon oxide film has been proposed. When nitrogen contained, this is known to elevate the dielectric constant and prevent the penetration of boron.

However, if such an oxynitride film is directly and simply formed by a thermal oxynitridation method, nitrogen is contained in a large amount at the interface with the silicon substrate and the device properties inevitably tend to be deteriorated. When nitrogen is contained at the interface, this is known to cause deterioration in the mobility of carrier and in turn in the transistor operation properties. Also, in an $SiO_2$/SiN stack structure combining the formation of thermal oxide film and the formation of SiN film by CVD (chemical vapor deposition), a trap (in-film level) of carrier is generated at the $SiO_2$/SiN interface and this tends to cause deterioration of the device properties, such as shifting of the threshold voltage.

When the $SiO_2$ film is intended to nitride by heating, a high temperature of 1,000° C. or more is usually necessary and in this heat step, differential diffusion of the dopant injected into the silicon substrate is liable to occur to deteriorate the device properties (such a method is disclosed in Japanese Unexamined Patent Publication (Kokai) Nos. 55-134937 and 59-4059).

DISCLOSURE OF THE INVENTION

An object of the present invention to overcome those problems in conventional techniques and provide an electronic device material comprising an oxynitride film having excellent properties (for example, excellent barrier property to boron), and a production process thereof.

Another object of the present invention is to provide an electronic device material comprising an oxynitride film formed to have good interface property (high mobility) by controlling the nitrogen content at the interface between the substrate and the oxynitride film and prevented from in-film level in the oxynitride film, and a production process thereof.

As a result of intensive investigations, the present inventors have found that when nitrogen on an electronic device substrate is disposed in the vicinity of a silicon oxynitride film surface in the nitrogen content distribution based on SIMS (secondary ion mass spectrometry) analysis, this is very effective for achieving the above-described objects.

The electronic device material of the present invention is accomplished based on this finding. More specifically, the electronic device material of the present invention is characterized by comprising at least an electronic device substrate and a silicon oxynitride film disposed on the substrate, wherein the silicon oxynitride film contains nitrogen atoms in a large amount in the vicinity of the surface when the nitrogen content distribution in the thickness direction of the silicon oxynitride film is examined by the SIMS (secondary ion mass spectrometry) analysis.

The present invention further provides a process for producing an electronic device material, comprising irradiating a plasma based on a process gas containing at least a nitrogen gas on a silicon oxide film disposed on an electronic device substrate, thereby forming a silicon oxynitride film containing nitrogen atoms in a large amount in the vicinity of the surface when the nitrogen content distribution in the thickness direction of the silicon oxynitride film is examined by the SIMS (secondary ion mass spectrometry) analysis.

The electronic device material constituted as above of the present invention can have excellent properties (for example, barrier property to boron) by virtue of a high N-atom concentration portion formed in the silicon oxynitride film constituting the electronic device material and also, can be prevented from deterioration of properties (for example, mobility) at the interface of silicon oxynitride film/electronic device substrate by virtue of the presence of a low N-atom concentration portion in the nitrogen content distribution.

BRIEF DESCRIPTION OF THE DRAWINGS

FIG. 1 is a schematic cross-sectional view showing one example of the MOS structure which can be formed by the present invention.

BEST MODE FOR CARRYING OUT THE INVENTION

Figure 2A:
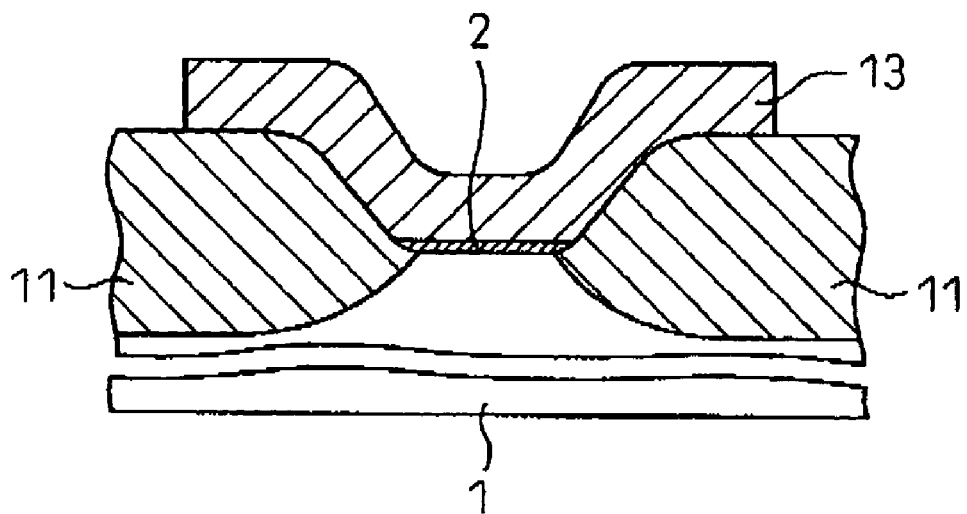
FIG. 2 is a schematic cross-sectional view showing one example of the semiconductor device which can be produced by the production process of an electronic device material of the present invention.

The present invention is described in detail below by referring to the drawings as needed. In the following, unless otherwise indicated, the "parts" and "%" showing the amount ratio are based on the mass.

(Electronic Device Material)

The electronic device material of the present invention comprises at least an electronic device substrate and a silicon oxynitride (SiON) film disposed on the substrate. In the present invention, the silicon oxynitride film has, in its thickness direction, a nitrogen content distribution based on the SIMS (secondary ion mass spectrometry) analysis.

(Electronic Device Substrate)

The electronic device substrate which can be used in the present invention is not particularly limited, and one or a combination of two or more appropriately selected from known electronic device substrates can be used. Examples of the electronic device substrate include semiconductor materials and liquid crystal device materials. Examples of the semiconductor material include a material mainly comprising single crystal silicon and a material mainly comprising silicon germanium, and examples of the liquid crystal device material include polysilicon and amorphous silicon formed on a glass substrate.

(Silicon Oxynitride Film)

In the present invention, the silicon oxynitride film is not particularly limited in the composition, shape, layer thickness, nitrogen atom distribution in layer (distribution) and the like as long as the silicon oxynitride film has a nitrogen content distribution based on the SIMS (secondary ion mass spectrometry) analysis. In the present invention, from the standpoint of preventing diffusion of a dopant (boron) in a P-type transistor, the nitrogen content is preferably 10% or more, more preferably 20% or more. On the other hand, from the standpoint of enhancing the dielectric constant, the nitrogen content is preferably from 20 to 40%. If the nitrogen content is too small, the effect of enhancing the dielectric constant is low, whereas if it is excessively high, nitrogen highly probably reaches the interface to deteriorate the carrier property (mobility) and the like at the interface. In general, it is known that the dielectric constant of silicon oxide film ($SiO_2$) is 3.9 and the dielectric constant of silicon nitride film ($Si_3N_4$) is 7. Accordingly, in the case of oxynitride film where the ratio of oxide film mixed is purely 1:0.2, the dielectric constant of the oxynitride film is $(3.9\times1+7\times0.2)\div(1+0.2)=4.1$. When this oxynitride film is used, a film having a thickness as large as $4.1\div3.9=1.1$ times as compared with the oxide film can be physically formed, but with such a film thickness, the effect of decreasing the power consumption by the enhancement of dielectric constant is insufficient. Therefore, a higher nitrogen content is more preferred. Conversely, if too high, a large amount of nitrogen is contained at the silicon substrate-oxide film interface to significantly deteriorate the properties at the interface (for example, deterioration of mobility) and this cancels the merit obtained by the thinning of film (high-speed operation by the reduction in the distance between source and drain). From these reasons, the nitrogen content is preferably controlled to a proper value.

The nitrogen content can be suitably measured by the SIMS (secondary ion mass spectrometry) method. Preferred conditions at this measurement of nitrogen content are shown below.

<Preferred Conditions for Nitrogen Content Measurement>
Measuring apparatus: Physical Electronics 6650
Primary ion species: Cs+
Primary acceleration voltage: 0.75 KV
Sputtering rate: about 9E-3 nm/sec
Measurement region: diameter 420 μm×672 μm
Degree of vacuum: 3E-7 Pa or less
Measured ion polarity: +
Charge-up compensation process: employed The signal intensity of ion is converted into the concentration with use of a relative sensitivity factor (RSF) determined by measuring an $SiO_2$ standard sample in which N is ion-injected. Also, the sputtering time is converted into the depth by measuring the depth of a crater generated upon analysis with use of a surface roughness meter (DEKTAK8000, manufactured by SLOAN).

(Nitrogen Atom Distribution)

In the present invention, from the standpoint of preventing penetration of boron or the like and making a good balance with the interface level at the oxynitride film/substrate interface, the half-width of the nitrogen atom distribution curve (profile) in the oxynitride film is preferably 2 nm or less, more preferably 1.5 nm or less, still more preferably 1 nm or less.

In view of the above-described good balance with the interface level at the oxynitride film/substrate interface, the oxynitride film, for use in the present invention preferably further has one or more properties of (1) to (3) below.

(1) The maximum value $N_s$ of the nitrogen atom content (atm %) in the range of 0 to 1.5 nm from the oxynitride film surface side (that is, a surface of the oxynitride film opposite the surface facing the substrate) is preferably from 10 to 30 atm %, more preferably from 20 to 30 atm %.

(2) The maximum value $N_b$ of the nitrogen atom content (atm %) in the range of 0 to 0.5 nm from the oxynitride film surface facing the substrate is preferably from 0 to 10 atm %, more preferably from 0 to 5 atm %.

(3) The ratio $N_s/N_b$ of $N_s$ and $N_b$ is preferably 2 or more, more preferably 3 or more, still more preferably 4 or more.

(Production Method of Electronic Device Material)

The electronic device material having such a constitution of the present invention is not particularly limited in its production process, but from the standpoint of ensuring a high nitrogen content and preventing the channel dopant from diffusing due to low heat history, a method of irradiating the silicon oxide film disposed on the electronic device substrate with a plasma based on a process gas containing at least a nitrogen gas is preferred.

When a plasma is used for the formation of oxynitride film of the present invention, this is advantageous in that the nitridation can be performed at a low temperature as compared with thermal nitridation and the channel dopant can be prevented from diffusing. Furthermore, nitridation of the $SiO_2$ film with use of a plasma is advantageous in that generally, a high-quality oxynitride film (for example, gate oxynitride film) reduced in the in-film level is readily obtained as compared with the case of forming a nitride film on an $SiO_2$ film by the CVD method.

(Treating Gas)

The process gas which can be used in the present invention is not particularly limited as long as it contains at least a nitrogen gas, and one or a combination of two or more appropriately selected from known process gases usable for the production of an electronic device can be used. Examples of the process gas include a mixed gas containing a rare gas and nitrogen ($N_2$).

(Rare Gas)

The rare gas which can be used in the present invention is not particularly limited and one or a combination of two or more appropriately selected from known rare gases usable for the production of an electronic device can be used. Examples of this process gas include krypton (Kr), xenon (Xe), helium (He), neon (Ne) and argon (Ar).

(Treating Gas Conditions)

In the production of oxynitride film of the present invention, in view of properties of the oxynitride film to be formed, the following conditions are preferably employed.

Rare gas (e.g., Kr, Ar, He, Xe):
   from 500 to 3,000 sccm, more preferably
   from 1,000 to 2,000 sccm
$N_2$: from 2 to 500 sccm, more preferably
   from 4 to 300 sccm
Temperature: from 25° C. (room temperature) to 500° C.,
   more preferably from 250 to 500° C.,
   still more preferably from 250 to 400° C.
Pressure: from 3 to 260 Pa, more preferably
   from 7 to 260 Pa, still more preferably from 7 to 130 Pa
Microwave: from 0.7 to 4.2 W/cm$^2$, more preferably
   from 1.4 to 4.2 W/cm$^2$, still more preferably from 1.4 to 2.8 W/cm$^2$ (Plane Antenna Member)

In the production process of an electronic device material of the present invention, when a microwave is irradiated through a plane antenna member having multiple slots, high-density plasmas having a low electron temperature can be formed in a large area with good uniformity. In the present invention, the oxynitride film is formed by using a plasma having such excellent properties and therefore, a low-temperature and highly reactive process with small plasma damage can be obtained.

(Preferred Plasma)

The properties of the plasma which can be preferably used in the present invention are as follows.
Electron temperature: 0.5-2.0 eV
Density: from 1E10 to 5E12/cm$^3$
Uniformity of plasma density: ±10%

According to the present invention, a good-quality oxynitride film can be formed. Therefore, by forming another layer (for example, electrode layer) on this oxynitride film, a semiconductor device structure having excellent properties can be easily fabricated.

(Preferred Properties of Oxynitride Film)

According to the present invention, an oxynitride film having the following preferred properties can be easily formed.
Electrical film thickness (equivalent film thickness):
from 1.0 to 2.5 nm
Leak properties:
reduced by a half to one digit as compared with Dry Ox
Uniformity of film thickness: ±2%

(Preferred Properties of Oxynitride Film)

The method of the present invention is not particularly limited in its application range, but the good-quality oxynitride film which can be formed by the present invention can be preferably used in particular as a gate insulating film of an MOS structure.

(Preferred Properties of MOS Semiconductor Structure)

The very thin and good-quality oxynitride film which can be formed by the present invention can be preferably used in particular as an insulating film (particularly, a gate insulating film of an MOS semiconductor structure) of a semiconductor device.

According to the present invention, an MOS semiconductor structure having preferred properties as described later can be easily produced. Incidentally, in evaluating the properties of the oxynitride film formed by the present invention, for example, a standard MOS semiconductor structure described in publications (see, *Oyo Butsuri* (*Applied Physics*), Vol. 69, No. 9, pp. 1049-1059 (2000)) is formed and by evaluating the properties of the MOS, the properties of the oxynitride film itself can be evaluated, because in such a standard MOS structure, the properties of the oxynitride film constituting the structure strongly affect the MOS properties.

(One Embodiment of Production Apparatus)

One preferred embodiment of the production process of the present invention is described below.

Figure 2B:
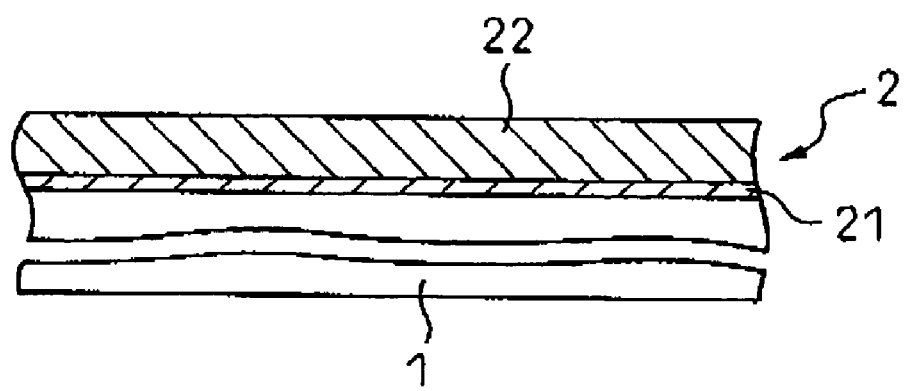

First, one example of the structure of a semiconductor device which can be produced by the production process of an electronic device material of the present invention is described by referring to FIG. 2 where the semiconductor device has an MOS structure using a gate insulating film as the insulating film.

Referring to FIG. 2(*a*), the reference numeral 1 in FIG. 2(*a*) is a silicon substrate, 11 is a field oxide film, 2 is a gate insulating film and 13 is a gate electrode. As described above, according to the production process of the present invention, a very thin and good-quality gate insulating film 2 can be formed. The gate insulating film 2 comprises, as shown in FIG. 2(*b*), a high-quality insulating film formed at the interface with the silicon substrate 1. For example, the gate insulating film is constituted by an oxide film 2 having a thickness of about 2.5 nm.

In this example, the high-quality oxide film 2 preferably comprises a silicon oxide film (hereinafter referred to as "$SiO_2$ film") formed on a substrate surface by using plasmas generated resulting from irradiation of a microwave on the substrate to be treated, which mainly comprises Si, through a plane antenna member having multiple slots in the presence of a process gas containing $O_2$ and a rare gas. When such an $SiO_2$ film is used, as described later, good interface properties (for example, interface level) can be easily obtained and an MOS structure fabricated can have good gate leak property.

In the present invention, the surface of the silicon oxide film 2 is preferably subjected to the above-described nitridation treatment. On the nitridation-treated surface of this silicon oxide film 2, a gate electrode 13 mainly comprising silicon (polysilicon or amorphous silicon) is further formed.

(Embodiment of Formation of Insulating Film)

One preferred example of the method for forming an insulating film comprising the gate insulating film 2 on a wafer W by using the above-described apparatus is described below.

FIG. 7 is a view showing one example of each step in the method of the present invention.

Referring to FIG. 7, a field oxide film channel implant working out to device separation and a sacrificial oxide film are formed on the wafer W surface in the step of A. In the step of B, the sacrificial oxide film is removed.

Figure 4:
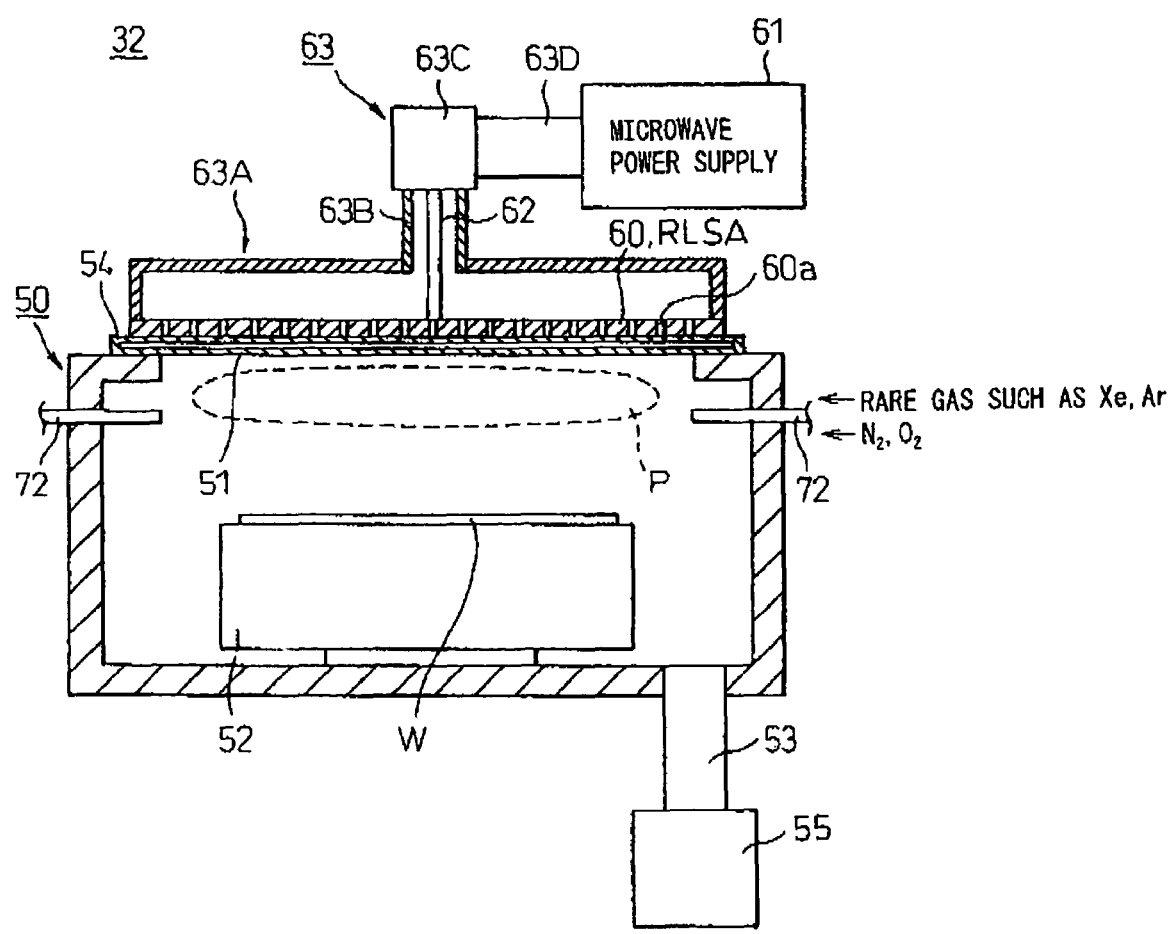
FIG. 4 is a schematic vertical cross-sectional view showing one example of the plane antenna (RLSA; sometimes called a slot plane antenna or SPA) plasma treatment unit which can be used in the production process of an electronic device material of the present invention.
Figure 5:
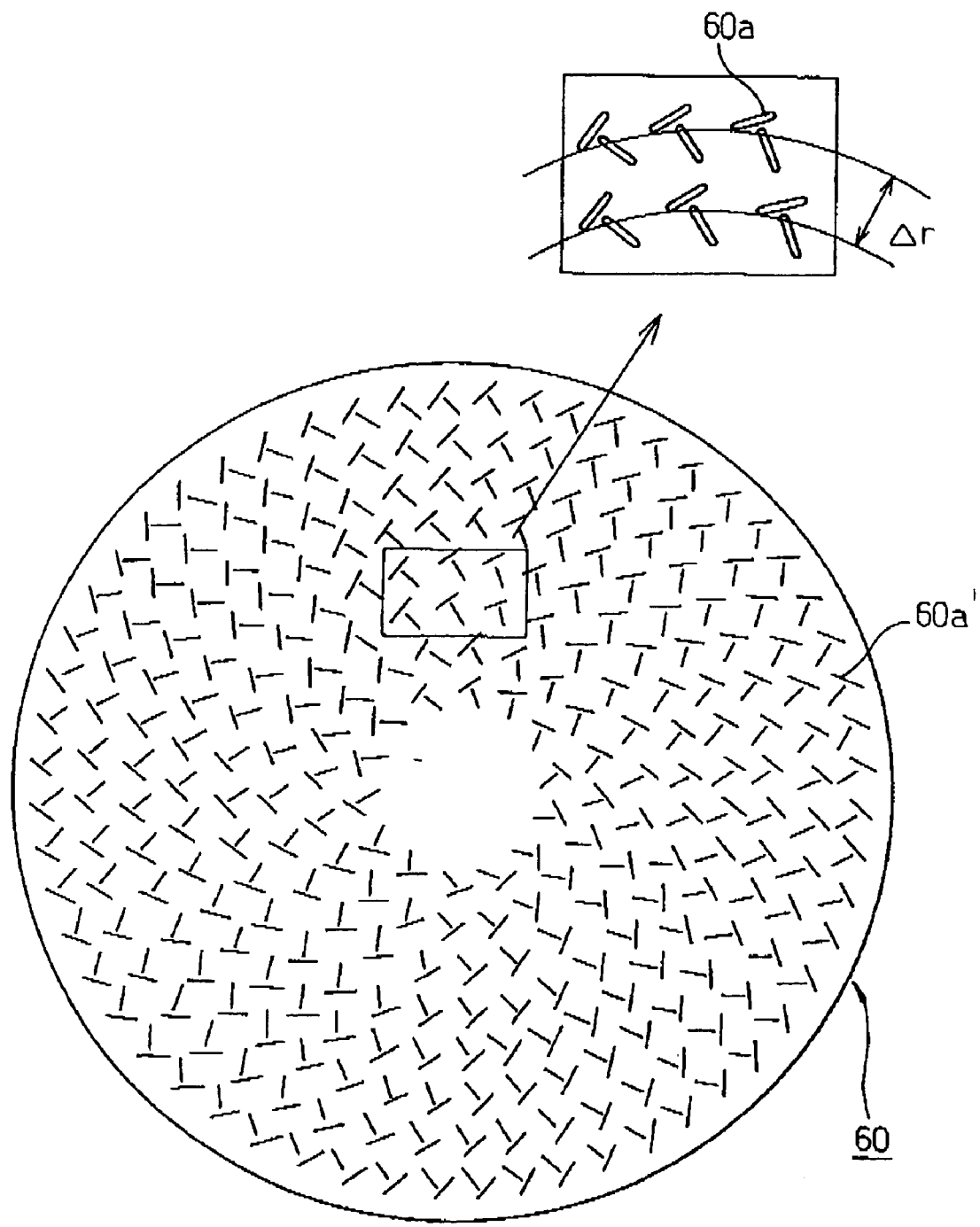
FIG. 5 is a schematic plan view showing one example of RLSA which can be used in the production apparatus of an electronic device material of the present invention.

Thereafter, a gate valve (not shown) provided on the side wall of a vacuum container 50 in a plasma treatment unit 32 is opened and the wafer W after the removal of sacrificial oxide film is set on the table 5 by using transportation arms 37 and 38 (see, FIG. 4).

Subsequently, after the gate valve is turned off to close the inside, the interior atmosphere is evacuated through an exhaust pipe 53 by a vacuum pump 55 to a predetermined degree of vacuum, and a predetermined pressure is maintained. Separately, a microwave of, for example, 2 W/cm² is generated from a microwave power supply 61 and this microwave is guided by a wave-guide path and introduced into the vacuum container 50 through RLSA 60 and a top plate 54, whereby high-frequency plasmas are generated in the plasma region P on the upper side in the vacuum container 50.

Here, the microwave is transmitted in a rectangular mode through a rectangular wave-guide tube 63D, converted from a rectangular mode into a circular mode by a coaxial wave-guide converter 63C, then transmitted in a circular mode through a cylindrical coaxial wave-guide tube 63B, further transmitted to the diameter direction through a plate-like wave-guide path 63A, radiated by slots 60*a* of RLSA60 and introduced into the vacuum container 50 through the top plate 54. At this time, high-density plasmas having a low electron temperature are generated because of use of a microwave and also, plasmas are uniformly distributed because the microwave is radiated through many slots 60*a* of RLSA60.

Thereafter, while heating the wafer W, for example, at 400° C. by controlling the table 52 temperature, a rare gas such as krypton or argon and an $O_2$ gas, which are the process gas for the formation of oxide film, are introduced from a gas supply tube 72 at a flow rate of 2,000 sccm and 200 sccm, respectively, to practice the step C (formation of oxide film).

Figure 8A:
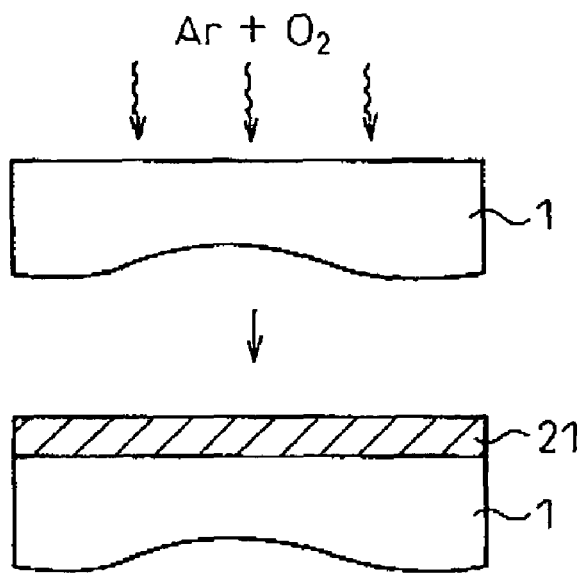

In this step C, the process gas introduced is activated (formed into radicals) by a plasma flow generated in the plasma treatment unit 32 and, as shown in the schematic cross-sectional view of FIG. 8(*a*), the silicon substrate 1 surface is oxidized under the action of the plasmas to form an oxide film ($SiO_2$ film) 2.

This oxidation treatment is performed, for example, for 40 seconds, whereby a 2.5 nm-thick gate oxide film or underlying oxide film (underlying $SiO_2$ film) 21 for gate oxynitride film can be formed.

Subsequently, the gate valve (not shown) is opened and transportation arms 37 and 38 (see, FIG. 3) are caused to proceed into the vacuum container 50 and receive the wafer W on the table 52. The transportation arms 37 and 38 take out the wafer W from the plasma treatment unit 32 and then set it on the table of an adjacent plasma treatment unit 33 (step 2). Depending on use, the gate oxide film is sometimes moved to a heating reaction furnace 47 without being nitrided.

(Embodiment of Nitride-Containing Layer Formation)

Figure 7A:
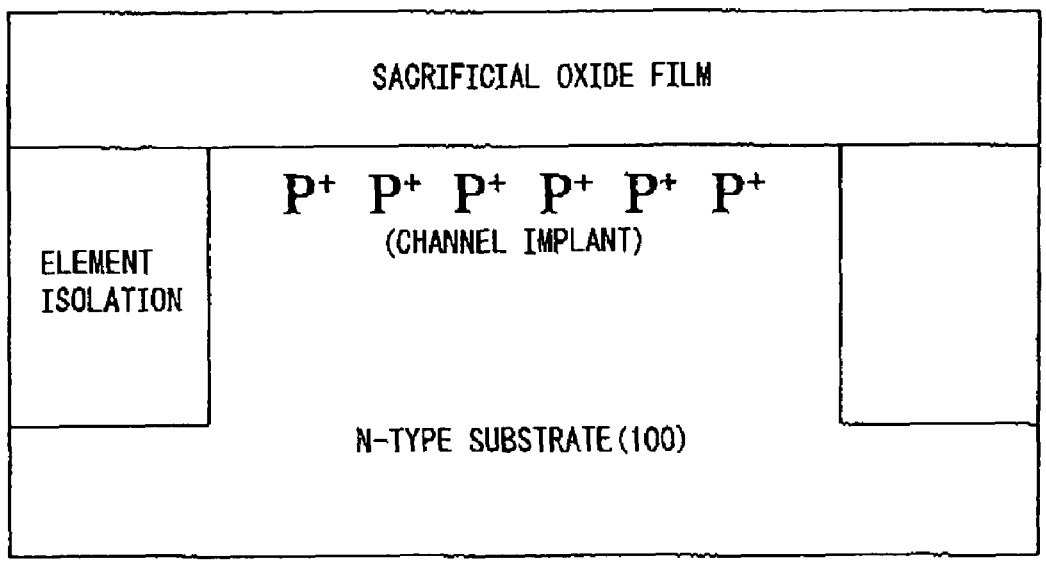
FIGS. 7 and 8 each is a flow chart showing one example of each process in the production process of the present invention.
Figure 7B:
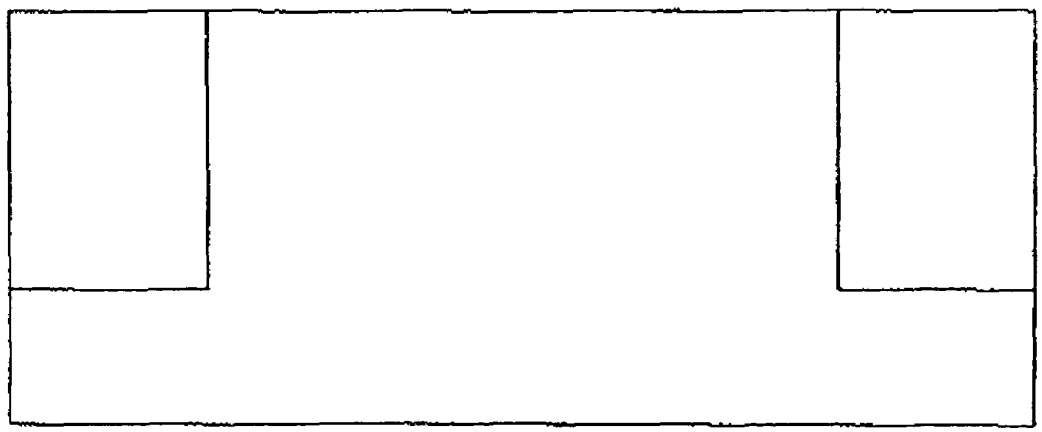
Figure 7C:
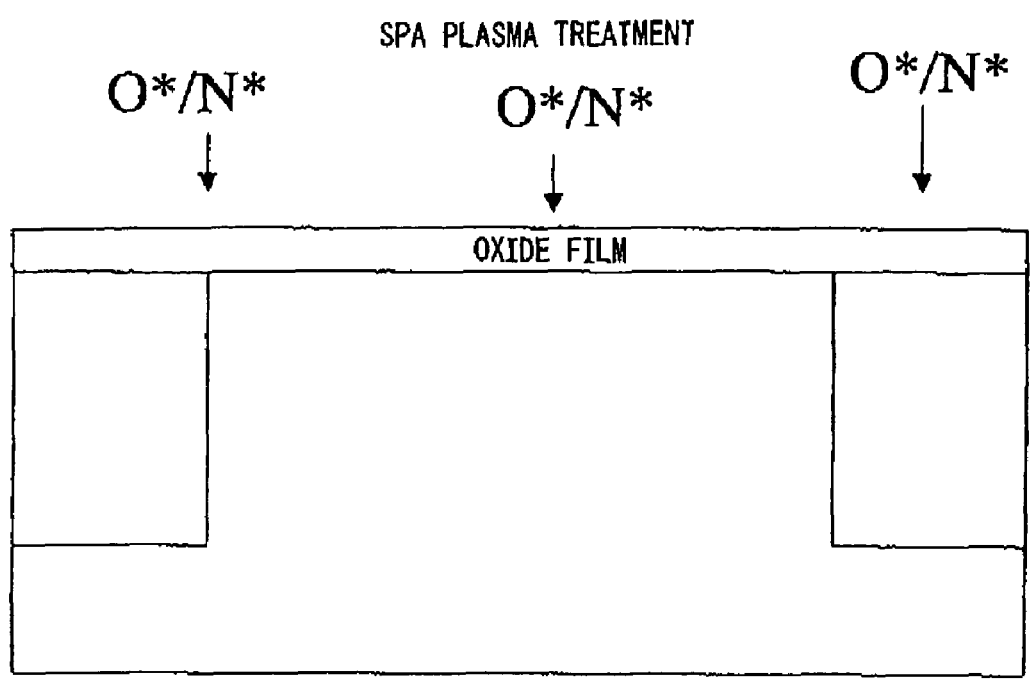
Figure 7D:
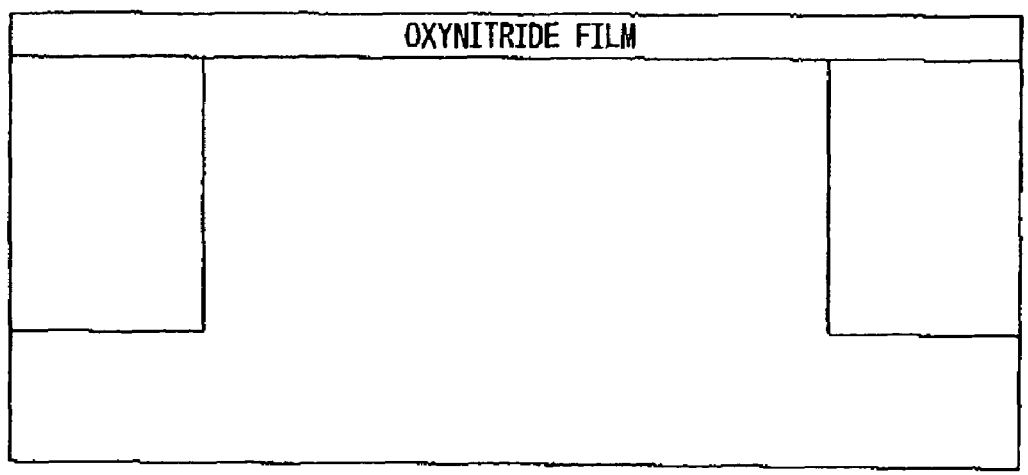
Figure 8B:
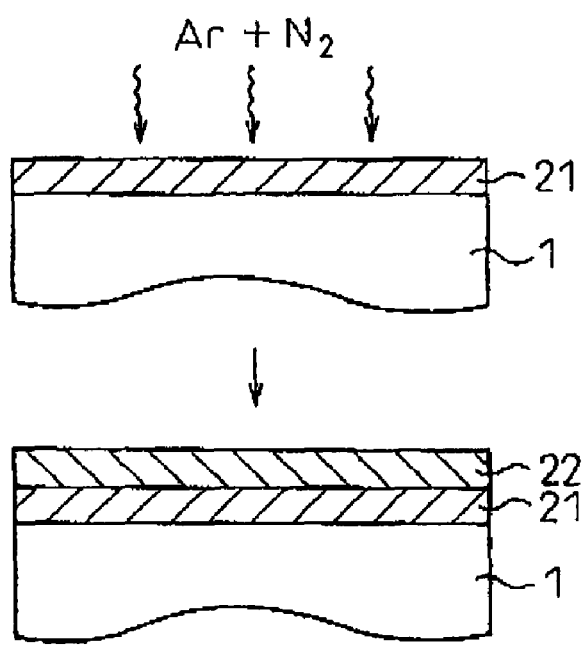

Thereafter, a surface nitridation treatment is applied to the wafer W in the plasma treatment unit 33 (see, FIG. 7(c)), and a nitride-containing layer 22 (see, FIG. 8(b)) is formed on the surface of the previously formed underlying oxide film (underlying $SiO_2$) 21.

At this surface nitridation treatment, the inside of, for example, a vacuum container 50 is in such a condition that the wafer temperature is, for example, 400° C. and the process pressure is, for example, 66.7 Pa (500 mTorr), and an argon gas and an $N_2$ gas are introduced into the container 50 from a gas inlet tube at a flow rate of 1,000 sccm and 40 sccm, respectively.

Separately, a microwave of, for example, 2 $W/cm^2$ is generated from a microwave power supply 61 and this microwave is guided by a wave-guide path and introduced into the vacuum container 50 through RLSA 60b and a top plate 54, whereby high-frequency plasmas are generated in the plasma region P on the upper side in the vacuum container 50.

In this step (surface nitridation), the gas introduced is plasmatized to form nitrogen radicals and the formed nitrogen radical reacts on the $SiO_2$ film formed on the upper surface of the wafer W, whereby the $SiO_2$ film surface is nitrided within a relatively short time. In this way, as shown in FIG. 8(b), a nitrogen-containing layer 22 is formed on the surface of the underlying oxide film (underlying $SiO_2$ film) 21 on the wafer W.

By performing this nitridation treatment, for example, for 20 seconds, a gate oxynitride film (acid nitride film) having a thickness of about 2 nm in terms of equivalent film thickness can be formed.

(Embodiment of Gate Electrode Formation)

Figure 7E:
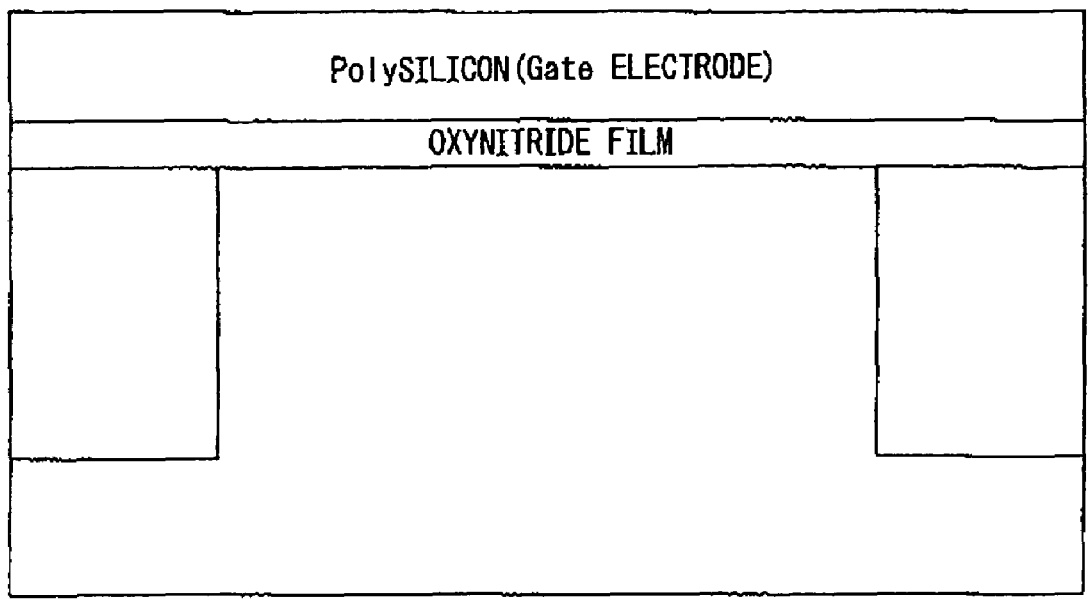
Figure 7F:
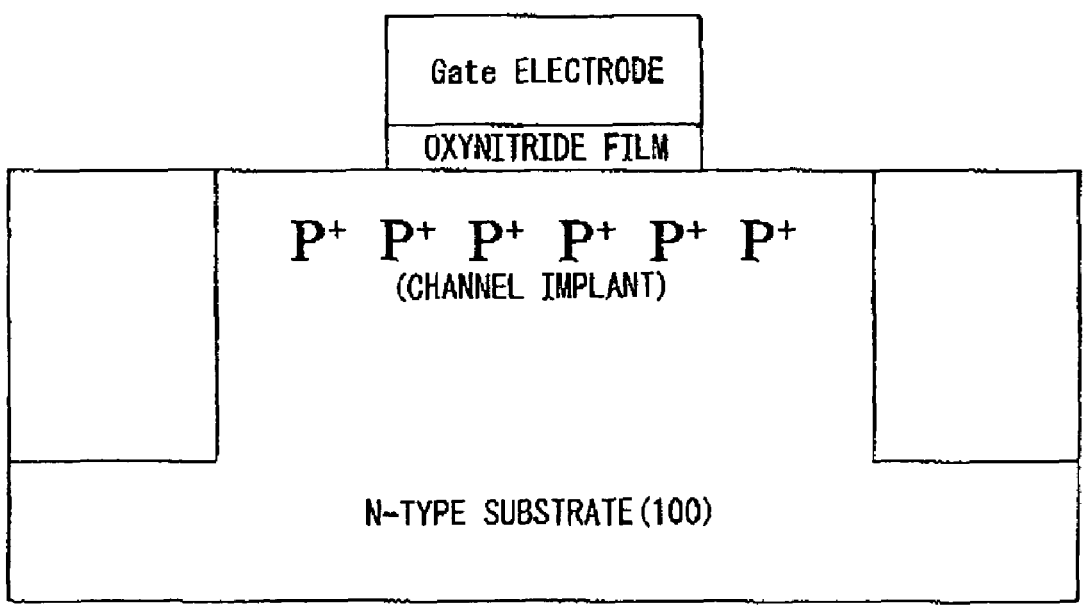
Figure 7G:
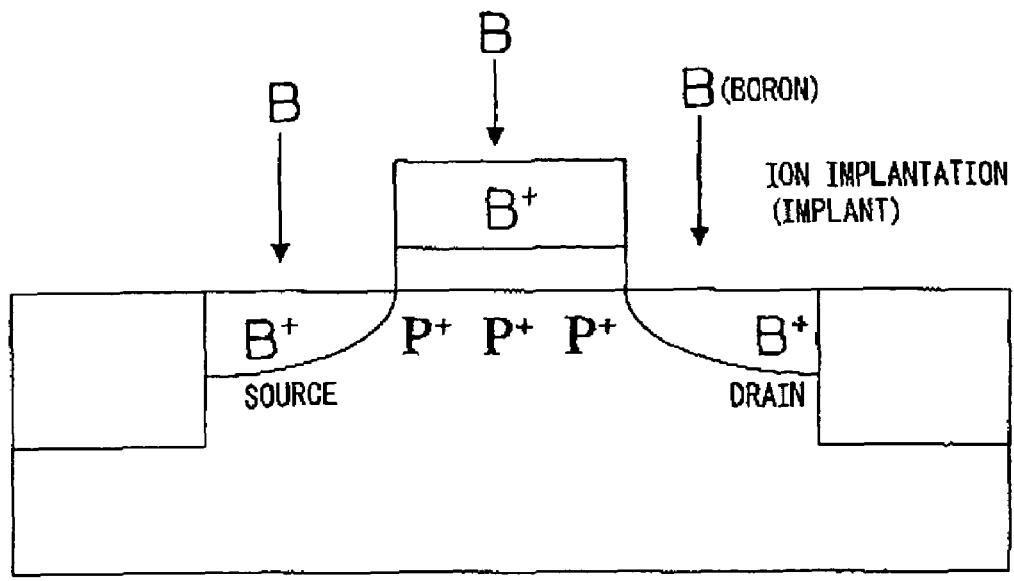
Figure 7H:
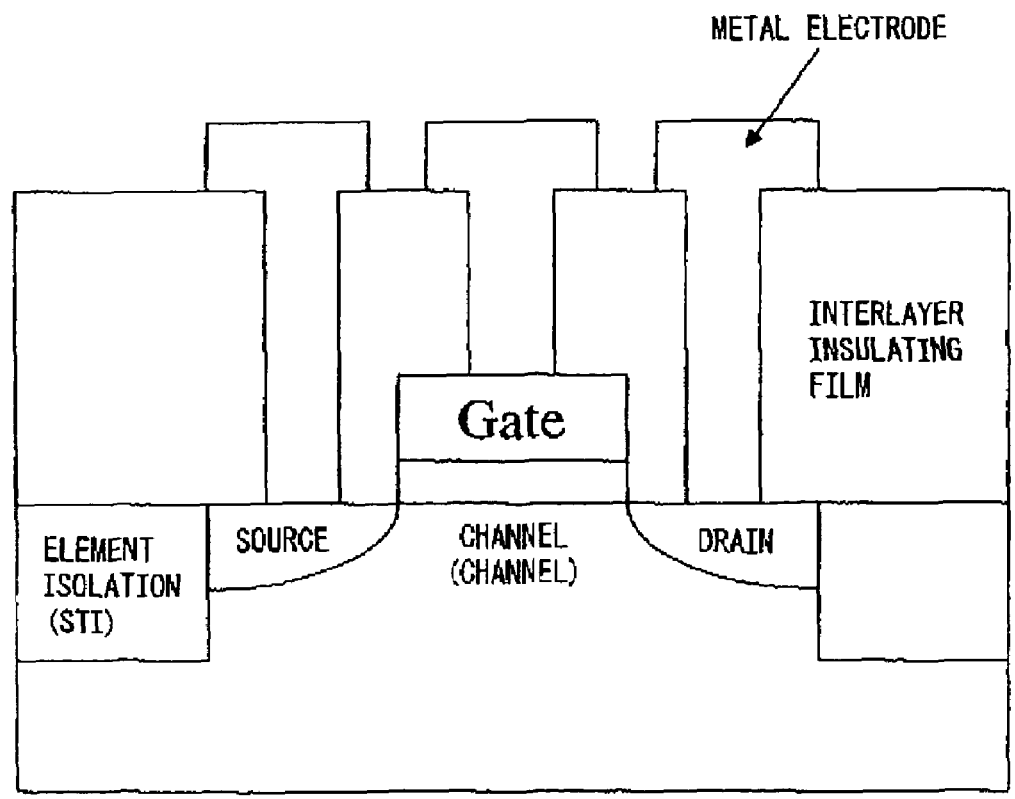

On the wafer W having formed thereon the $SiO_2$ film or the oxynitride film resulting from nitridation of the underlying $SiO_2$ film, a gate electrode (see, FIG. 7E(a); 13 of FIG. 2) is formed. In the formation of this gate electrode 13, the wafer having formed thereon the gate oxide film or gate oxynitride film is taken out from the plasma treatment unit 32 or 33, respectively, and after once taken out to the transportation chamber 31 (see, FIG. 3) side, housed in the heating reaction furnace 47 (step 4). In the heating reaction furnace 47, the wafer W is heated under predetermined treatment conditions to form a predetermined gate electrode 13 on the gate oxide film or gate oxynitride film.

At this time, the treatment conditions can be selected according to the kind of the gate electrode 13 formed.

More specifically, in the case of forming a gate electrode 13 comprising polysilicon, the treatment is preformed by using, for example, $SiH_4$ as the process gas (electrode-forming gas) under the conditions such that the pressure is from 20 to 33 Pa (from 150 to 250 mTorr) and the temperature is from 570 to 630° C.

In the case of forming a gate electrode 13 comprising amorphous silicon, the treatment is preformed by using, for example, $SiH_4$ as the process gas (electrode-forming gas) under the conditions such that the pressure is from 20 to 67 Pa (from 150 to 500 mtorr) and the temperature is from 520 to 570° C.

Furthermore, in the case of forming a gate electrode 13 comprising SiGe, the treatment is performed by using, for example, a mixed gas of $GeH_4/SiH_4$=10/90 to 60/40% under the conditions such that the pressure is from 20 to 60 Pa and the temperature is from 460 to 560° C. Thereafter, patterning and etching of the gate electrode are performed (see, FIG. 7F), the source and drain are formed (see, FIG. 7G) and a wiring step is performed (see, FIG. 7H), whereby a e-type MOS transistor is formed.

(Quality of Oxide Film)

In the above-described first step, at the formation of gate oxide film or underlying oxide film for gate oxynitride film, plasmas containing oxygen ($O_2$) and a rare gas are formed by irradiating a microwave on the wafer W mainly comprising Si through a plane antenna member (RLSA) having many slots in the presence of the process gas and by using the plasmas formed, an oxide film is formed on a surface of the substrate to be treated, so that the oxide film can have high quality and the film quality can be successfully controlled.

(Presumed Mechanism of High-Quality Oxynitride Film)

Also, the oxynitride film obtained by performing a surface nitridation treatment in the above-described second step has an excellent quality. According to the knowledge of the present inventors, the reasons therefor are presumed as follows.

The nitrogen radicals produced on the oxide film surface by RLSA are in a high density and therefore, nitrogen can be mixed into the oxide film surface in a unit of percent. Also, as compared with production of nitrogen radicals by heat, high-density nitrogen radicals can be produced even at a low temperature (about 300° C.) and therefore, the device properties can be prevented from deterioration due to heat as represented by diffusion or the like of dopant. Furthermore, since nitrogen in the film is contained in the oxide film surface, it is possible to enhance the dielectric constant and exert the performance such as effect of preventing penetration of boron without deteriorating the interface properties, (Presumed Mechanism of Preferred MOS Properties)

In the above-described third step, a gate electrode obtained by applying a heat treatment under specific conditions is formed and thereby, an MOS-type semiconductor structure having excellent properties is fabricated. According to the knowledge of the present inventors, the reasons therefor are presumed as follows.

In the present invention, as describe above, a very thin and good-quality gate insulating film can be formed. By combining such a good-quality gate insulating film (gate oxide film and/or gate oxynitride film) with a gate electrode (for example, polysilicon, amorphous silicon or SiGe by CVD) formed thereon, good transistor properties (for example, good interface properties) can be realized.

Figure 3:
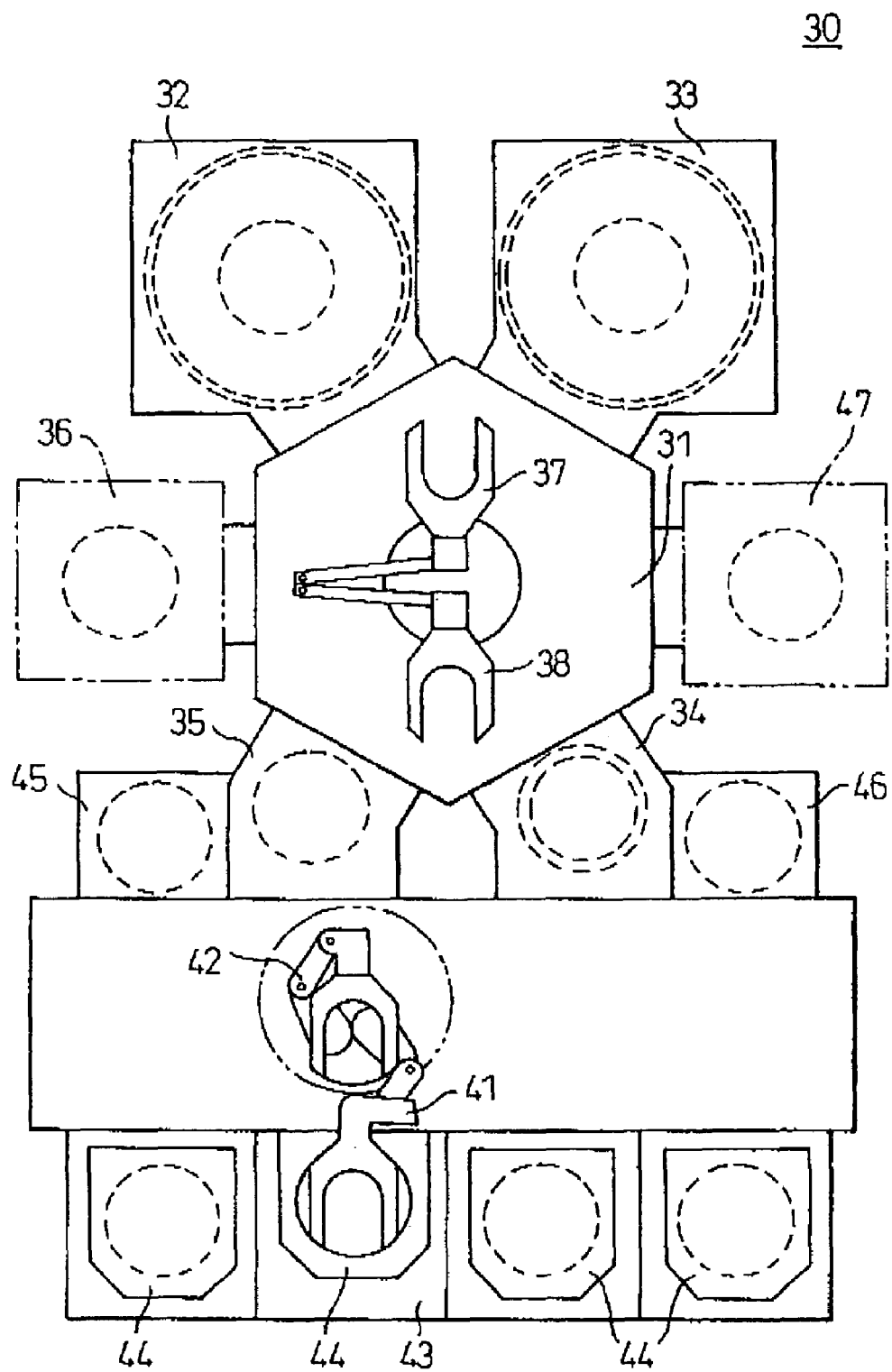
FIG. 3 is a schematic plan view showing one example of the apparatus for producing a semiconductor, which is used for practicing the production process of an electronic device material of the present invention.

Furthermore, by establishing a cluster system shown in FIG. 3, exposure to air can be prevented from occurring between the formation of gate oxide film or gate oxynitride film and the formation of gate electrode, and the interface properties can be more enhanced.

The present invention is described in greater detail below by referring to Examples.

EXAMPLES

Example 1

The oxynitride film subjected to evaluation described later was produced through the following steps (1) to (7).

(1) Substrate

A 20-cm (8-inch) P-type or N-type silicon substrate having a resistivity of 8 to 12 Ωcm and a plane direction of (100) was used for the substrate.

(2) Washing before Gate Oxidation

A natural oxide film and contaminant factors (metal, organic material and particle) were removed by RCA washing where APM (a mixed solution of ammonia:aqueous hydrogen peroxide:pure water=1:2:10, 60° C.), HPM (a mixed solution of hydrochloric acid:aqueous hydrogen peroxide:pure water=1:1:10, 60° C.) and DHF (a mixed solution of hydrofluoric acid:pure water=1:100, 23° C.) were combined. In the RCA washing, APM: 10 minutes→pure water rinsing: 10 minutes→DHF: 3 minutes→pure water rinsing: 10 minutes→HPM: 10 minutes→pure water rinsing: 10 minutes→final pure water rinsing: 5 minutes were performed and thereafter, IPA (isopropyl alcohol, 220° C.) drying was performed for 15 minutes to dry the water content on the wafer.

(3) Oxidation Process

On the silicon substrate treated in (2) above, an oxide film was formed by the following method.

That is, the silicon substrate treated in (2) above was carried into a reaction chamber heated to 300° C. at an atmospheric pressure. After the wafer was carried in, a nitrogen gas was introduced at 5 slm and the pressure was kept at 0.7 KPa. In this atmosphere, the wafer was heated at 850° C. and after the temperature was stabilized, an oxygen gas and a hydrogen gas were introduced at 0.7 slm and 0.1 slm, respectively. In this state, the silicon substrate was held for 3 minutes, whereby a thermal oxide film of 2 nm was formed. After this oxidation treatment, in an atmosphere where a nitrogen gas was introduced at 3 slm, the temperature was dropped to 300° C., the reaction chamber was returned to an atmospheric pressure, and then the wafer was carried out.

(4) Plasma Nitridation Process

The oxide film after the treatment in (3) above was subjected to nitridation. In this plasma nitridation process, a plasma device system shown in FIG. 4 was used.

That is, in the plasma device system, an Ar gas and a nitrogen gas were passed on the silicon substrate heated at 250° C. or 400° C., at 1,000 sccm and 40 sccm, respectively, and the pressure was kept at 6.7 Pa or 67 Pa (50 mTorr or 500 mTorr). In this atmosphere, a microwave of 3 W/cm$^2$ was irradiated through a plane antenna member (RLSA) having multiple slots to form plasmas containing nitrogen gas and argon gas and by using the plasmas formed, the oxide film was nitrided to form an oxynitride film (acid nitride film). The evaluations shown in FIGS. 9 to 12 were performed by using a sample treated until this step (4).

(5) Penetration of Boron

For evaluating the penetration of boron, a polysilicon film was further formed on the oxynitride film after the treatment in (4).

More specifically, the silicon substrate subjected to the treatment of (4) was heated to 630° C., a silane gas (SiH$_4$) was introduced onto the substrate at 250 sccm, and the pressure was kept at 33 Pa (250 mTorr) for 31 minutes, whereby a polysilicon film having a thickness of 300 nm was formed. On this polysilicon, boron was injected by ion implantation. The injection conditions were such that the density was 5E15 [$5\times10^{15}$ atms/cm$^2$] and the injection energy was 5 KeV. The boron ion implanted does not play as is the role of a dopant (impurity) in the film and must be thermally annealed to accelerate its chemical combining with the silicon atom in the polysilicon. The thermal annealing was performed by an RTA (rapid thermal annealing) treatment of heating the wafer at a high speed to 1,000° C. under an atmospheric pressure where nitrogen was introduced at 2,000 sccm, and keeping the wafer at the high temperature for 10 seconds.

Example 2

Samples treated until the step (4) above in Example 1 each was subjected to SIMS analysis to evaluate the nitrogen content in film. At the same time, the oxygen and silicon element were analyzed and from these results, the nitridation reaction was examined.

FIGS. 9 to 13 each shows the secondary ion mass spectrometry (SIMS) results of nitrogen atom when the thermal oxide film is subjected to the nitridation plasma treatment. The abscissa denotes the film thickness and the ordinate denotes the nitrogen content. The SIMS conditions used here were as follows.

<SIMS Conditions>
Measuring apparatus: Physical-Electronics 6650
Primary ion species: Cs+
Primary acceleration voltage: 0.75 KV
Sputtering rate: about 9E-3 nm/sec
Measurement region: diameter 420 μm×672 μm
Degree of vacuum: 3E-7 Pa or less
Measured ion polarity: +
Charge-up compensation process: employed The signal intensity of ion was converted into the concentration with use of a relative sensitivity factor (RSF) determined by measuring an SiO$_2$ standard sample in which N was ion-injected. Also, the sputtering time was converted into the depth by measuring the depth of a crater generated upon analysis with use of a surface roughness meter (DEK-TAK8000, manufactured by SLOAN). However, in this measurement, the analysis region was very shallow and the depth could be hardly measured by the surface roughness meter. Therefore, the conversion into the depth was performed by using a sputter rate obtained from a standard sample which was measured under the same conditions as each sample.

Figure 9:
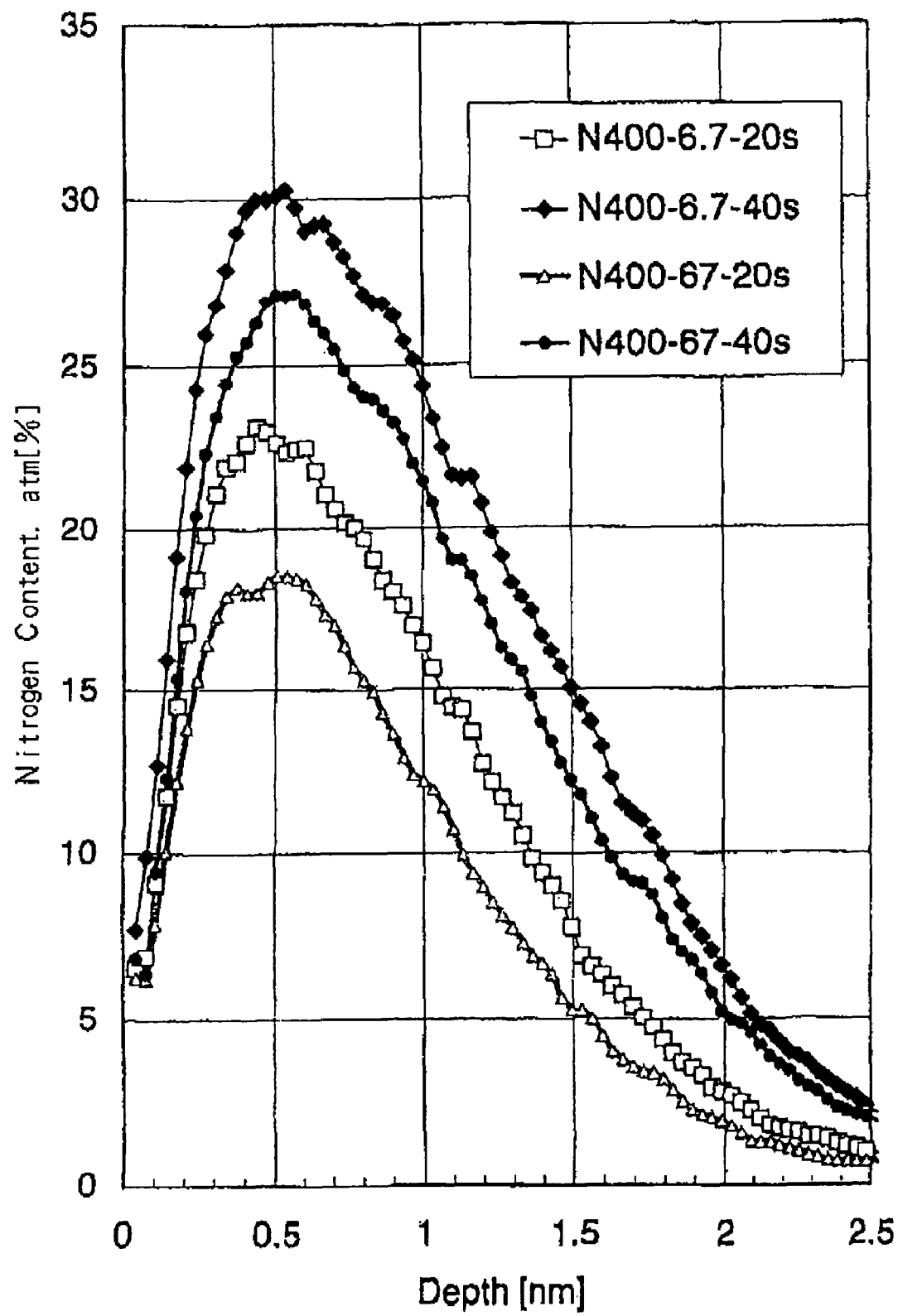
FIG. 9 is a graph showing the SIMS analysis results of the oxynitride film obtained in Example.
Figure 10:
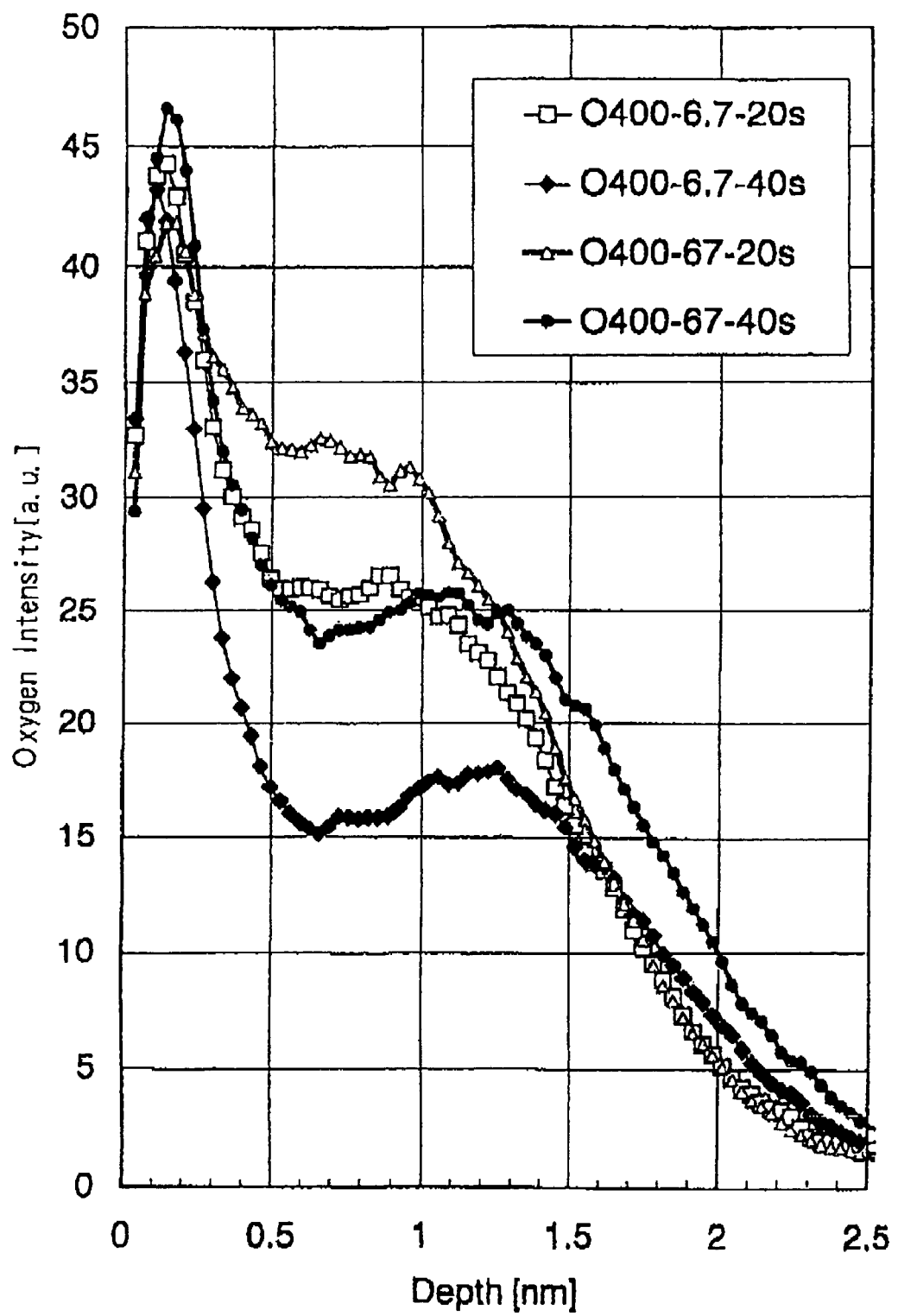
FIG. 10 is a graph showing the SIMS analysis results of the oxynitride film obtained in Example.
Figure 11:
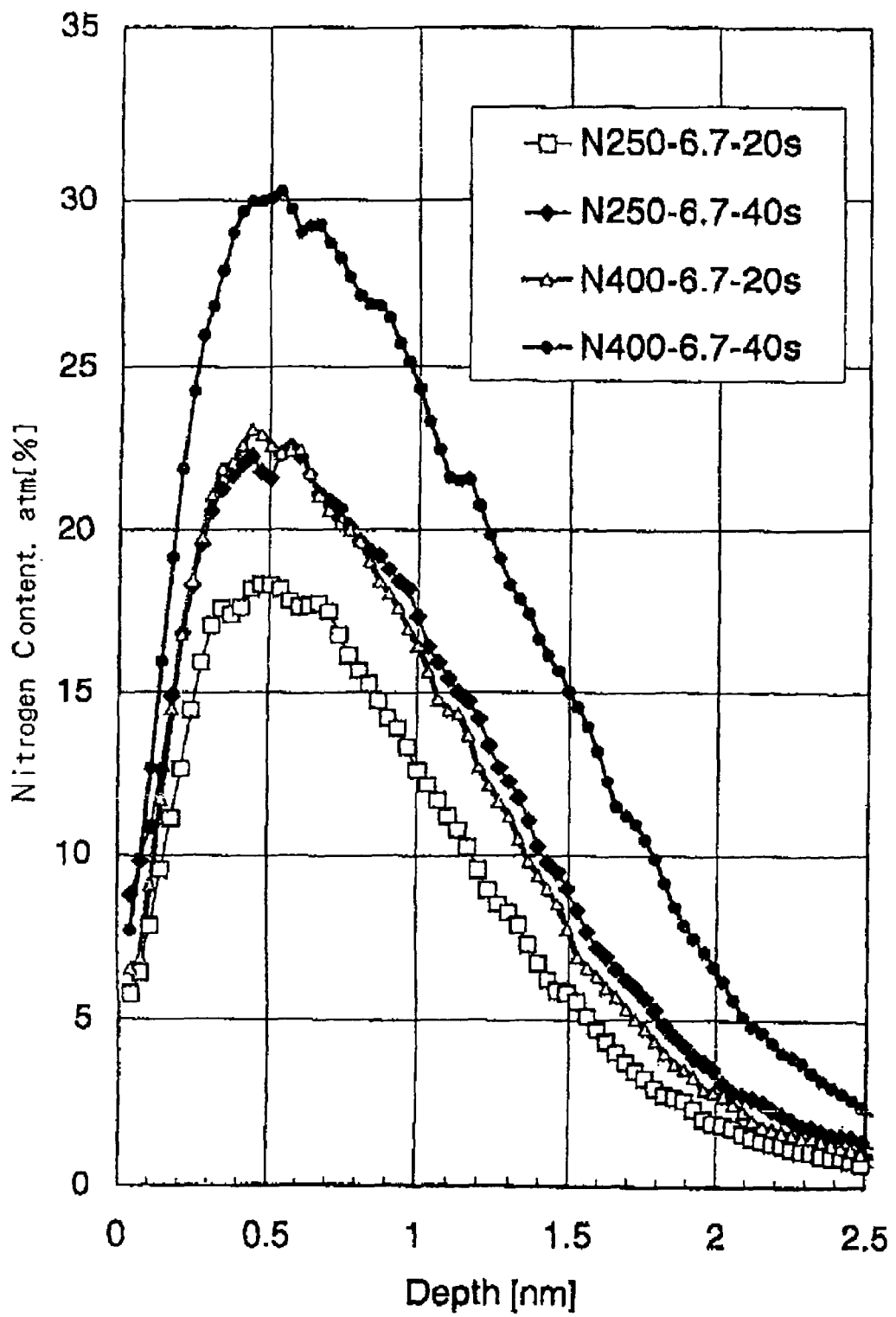
FIG. 11 is a graph showing the SIMS analysis results of the oxynitride film obtained in Example.
Figure 13:
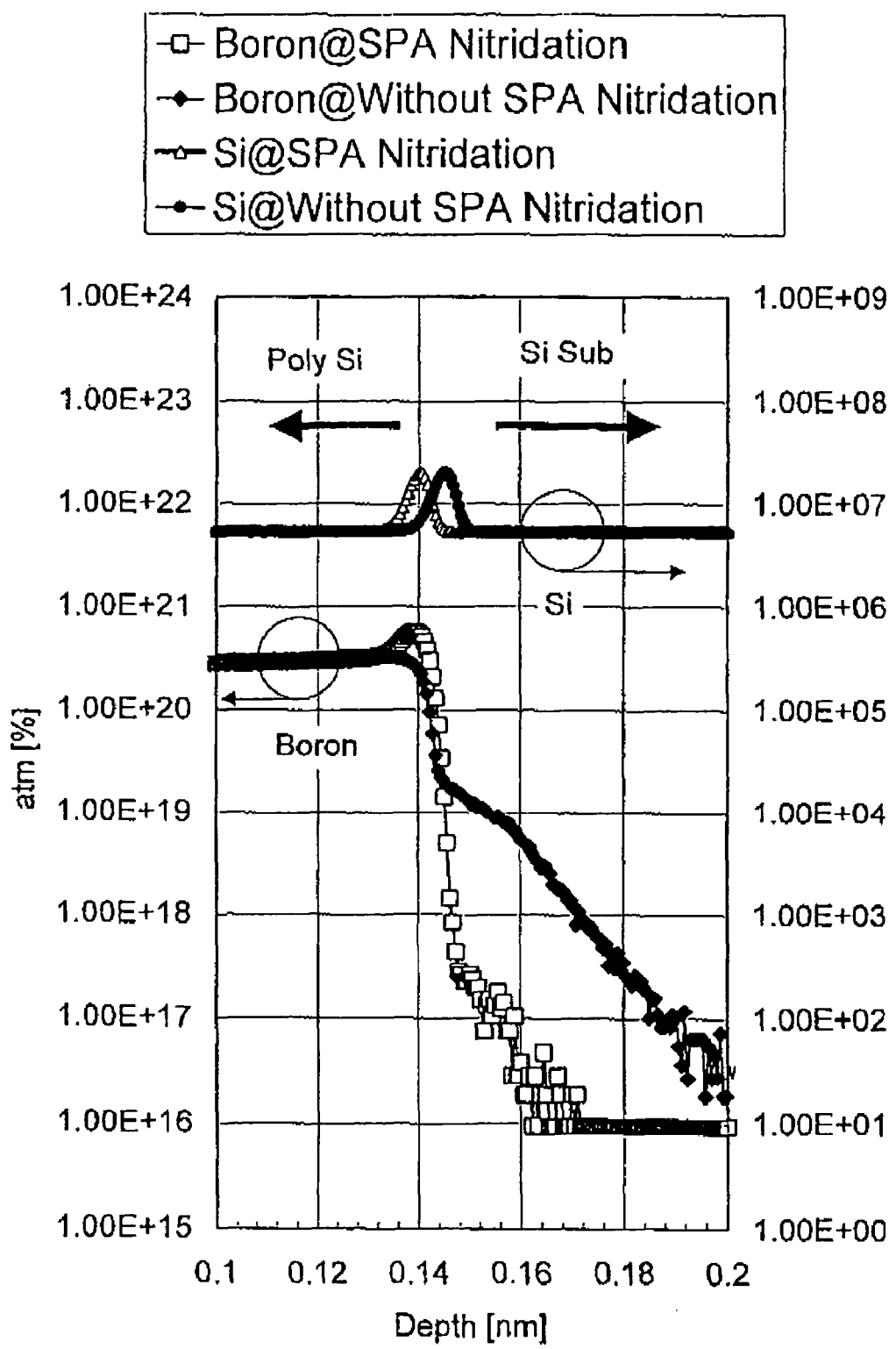
FIG. 13 is a graph showing the results in the boron penetration test of the oxynitride film obtained in Example.

As shown in FIGS. 9 and 11, when the method for forming an oxynitride film of the present invention was used, nitrogen could be successfully contained in the film to account for from 15 to 30%. Also, as shown in FIG. 13 which is described later, the penetration of boron could be prevented by applying a nitridation treatment.

FIG. 9 shows the nitrogen content when the pressure at nitridation is changed while setting the substrate temperature to 400° C. Under both the low pressure (6.7 Pa) and the high pressure (67 Pa), the nitrogen content was increases as the nitridation time was increased. Under the low pressure, a larger amount of nitrogen was contained in the film. FIG. 3 shows the oxygen signal intensity when the pressure is changed. As the nitridation time was increased, the oxygen content was decreased. Under the low pressure, the oxygen content was significantly decreased in the vicinity of 0.5 to 1.5 nm and this reveals that a displacement reaction between oxygen and nitrogen was generated. Under the high pressure, the oxygen was pushed out to the region thicker than 1.5 nm and this reveals that physical film thickness was increased.

FIG. 11 shows the nitrogen content when the temperature at nitridation is changed. At both the low temperature (250° C.) and the high temperature (400° C.), the nitrogen content was increased as the nitridation time was increased.

Figure 12:
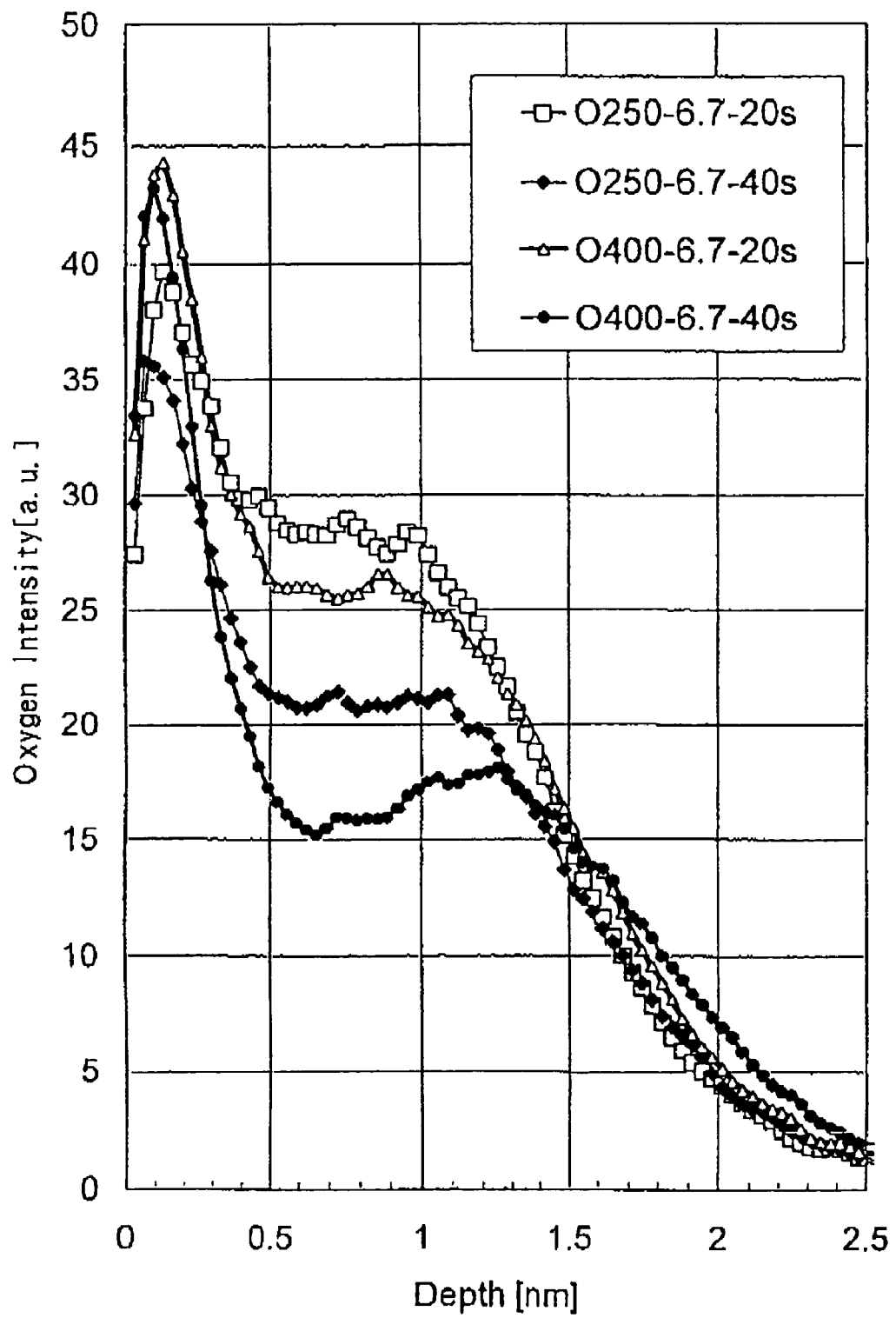
FIG. 12 is a graph showing the SIMS analysis results of the oxynitride film obtained in Example.

FIG. 12 shows the oxygen content when the temperature is changed. As described above, the nitrogen content was the same between the process at low temperature for 40 seconds and the process at high temperature for 20 seconds, nevertheless, a great difference was generated in the oxygen content. This is considered because at the low temperature, a reaction of displacing oxygen and nitrogen mainly occurred at nitridation, whereas at the high temperature, a reaction of cutting the bond between silicon and oxygen and immixing nitrogen mainly occurred.

From these, it is verified that when the nitridation treatment is applied according to the present invention, an oxynitride film having a dielectric constant higher than that of normal oxide film is formed. Also, as shown in FIGS. 9 and 11, the nitrogen concentration in film can be freely controlled by changing the nitridation conditions and when the present invention is used, an oxynitride film having a nitrogen concentration suited to the purpose can be formed.

Example 3

Figure 6:
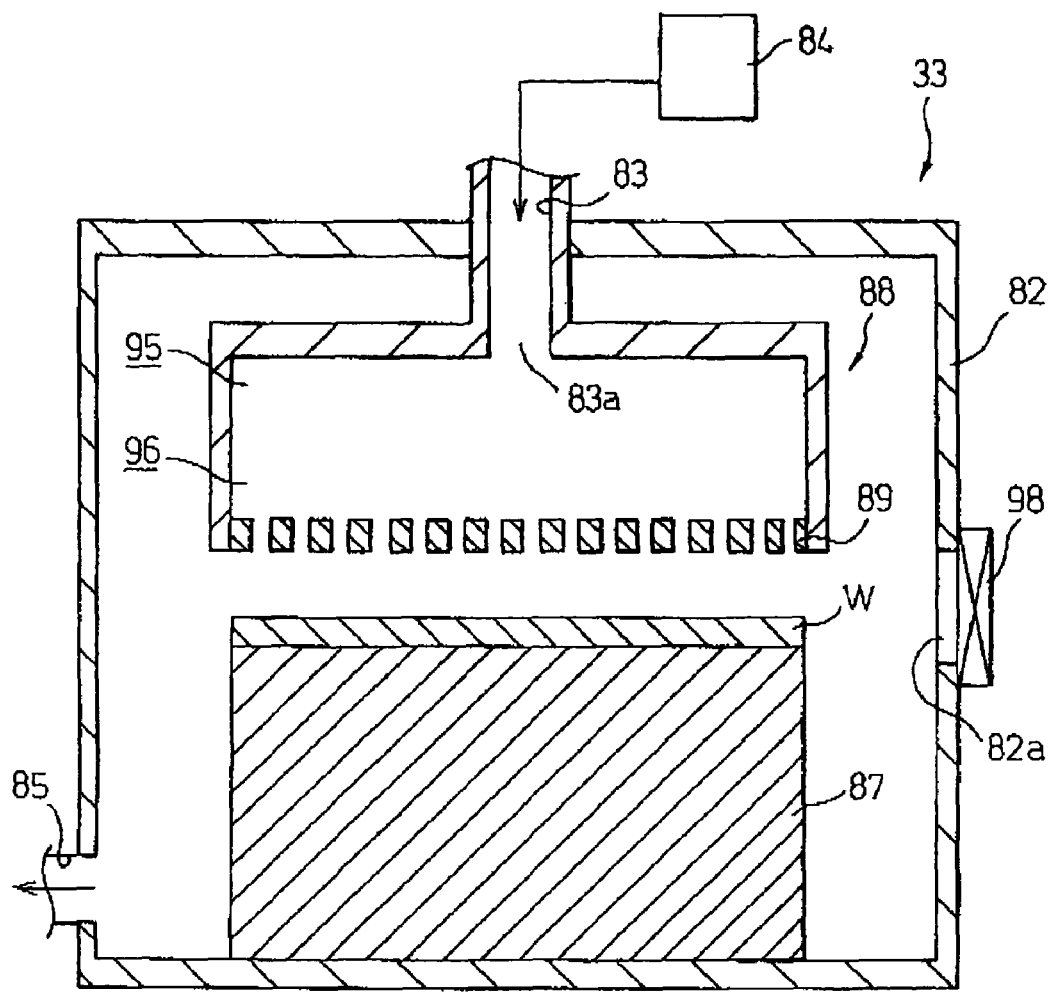
FIG. 6 is a schematic vertical cross-sectional view showing one example of the heating reaction furnace unit which can be used in the production process of an electronic device material of the present invention.

In this Example, the effect of preventing penetration of boron was evaluated. FIG. 6 shows the results after the penetration degree of boron in a P-type MOS capacitor is examined by SIMS. The sample used in FIG. 13 was using an N-type silicon substrate (phosphorus-doped) as the silicon substrate and treated until the step (5) of Example 1.

In the SIMS analysis, a backside SIMS analysis method was used and the sputtering was performed with ion from the back surface (on the substrate side), because if the SIMS analysis is performed from the normal front surface (on the gate electrode side), boron in the gate electrode passes through the oxide film due to sputtering at the analysis and reaches the substrate and the penetration of boron can be hardly evaluated. The backside SIMS conditions used here were as follows.

<Backside SIMS Conditions>
Measuring apparatus: CAMECA IMS-6f
Primary ion species: $O_2+$
Primary acceleration voltage: 3.0 KV
Sputtering rate: about 0.2 nm/sec
Measurement region: 30 μm-diameter circle
Degree of vacuum: 3E-7 Pa or less
Measured ion polarity: +
Charge-up compensation process: not employed
Interfering ion removal process: not employed The signal intensity of ion was converted into the concentration with use of a relative sensitivity factor (RSF) determined by measuring an Si standard sample in which B was ion-injected. Also, the sputtering time was converted into the depth by measuring the depth of a crater generated upon analysis with use of a surface roughness meter (DEKTAK3030 or DEKTAKS8000, manufactured by SLOAN). The precision of depth in the Si substrate depends on the stability of apparatus and is considered to be about ±10%, but in practice, the measurement is performed from the substrate side of sample and the depth is inverted by data processing, therefore, the absolute depth such as position of interface has no meaning.

As apparent from FIG. 13, boron (B) did not reach the substrate when the nitridation treatment was applied, and this reveals that the shifting or the like of threshold voltage was prevented. Also, the Figure clearly shows that when nitridation was not applied, boron was bled out from the gate electrode side at the annealing for activation and passed through the oxide film to reach the substrate. The P-type MOS transistor is operated by applying a reverse bias to the channel on the substrate side and thereby inducing pores, but the escape of boron causes decrease in the resistance of polysilicon, as a result, a depletion layer may be generated in the polysilicon electrode upon application of a reverse bias and the electrical film thickness may be increased. However, as shown in the Figure, when the nitridation treatment was applied, boron is degenerated (piled up) on the oxynitride film surface and the above-described deterioration of properties can be prevented.

INDUSTRIAL APPLICABILITY

As described in the foregoing pages, according to the present invention, an electronic device material comprising an oxynitride film having excellent properties and prevented from interface level at the interface with the substrate, and a production process thereof are provided.

The invention claimed is:

1. A process for treating a substrate by plasma nitridation, comprising:
   providing the substrate having an oxide film thereon; and
   irradiating plasma having an electron temperature of 0.5 to 2.0 eV on the oxide film using a mixed gas comprising argon gas and nitrogen gas to form an oxynitride film, wherein
   the plasma is irradiated on the oxide film at a temperature of 250 to 500° C. and under a pressure of 7 to 260 Pa,
   a nitrogen atom content in the oxynitride film has a distribution such that the maximum value Ns of the nitrogen atom content in the oxynitride film at a surface of the oxynitride film opposite a surface facing the substrate is 10 to 40 atomic percent, and the maximum value Nb of the nitrogen atom content in the oxynitride film at the surface facing the substrate side is 0 to 10 atomic percent,
   the ratio Ns/Nb is 2 or more, and
   the oxynitride film has an electrical film thickness from 1.0 to 2.5 nm.

2. A process according to claim 1, wherein the plasma is generated using microwave irradiation by using a plane antenna member having a plurality of slots.

3. A process according to claim 1, wherein the oxide film is formed by plasma processing or thermal oxidation.

4. A process for treating a substrate by plasma nitridation, comprising:
   forming an oxide film on the substrate; and
   irradiating plasma on the oxide film using a mixed gas comprising argon gas and nitrogen gas to form an oxynitride film, wherein
   the plasma is irradiated on the oxide film at a temperature of 250 to 500° C. and under a pressure of 7 to 260 Pa,
   a nitrogen atom content in the oxynitride film has a distribution such that the maximum value Ns of the nitrogen atom content in the oxynitride film at a surface of the oxynitride film opposite a surface facing the substrate is 10 to 40 atomic percent, and the maximum value Nb of the nitrogen atom content in the oxynitride film at the surface facing the substrate side is 0 to 10 atomic percent,
   the ratio Ns/Nb is 2 or more, and
   the oxynitride film has an electrical film thickness from 1.0 to 2.5 nm.

5. A process according to claim 4, wherein the plasma is generated using microwave irradiation by using a plane antenna member having a plurality of slots.

6. A process according to claim 4, wherein the ratio Ns/Nb is 4 or more.

7. A process for forming a gate oxynitride film, comprising:
   providing a substrate having an oxide film thereon; and
   irradiating plasma having density of $1 \times 10^{10}$ to $5 \times 10^{12}/cm^3$ and an electron temperature of 0.5 to 2.0 eV on the oxide film using a mixed gas comprising argon gas and nitrogen gas to form the oxynitride film, wherein the plasma is irradiated on the oxide film at a temperature of 250 to 500° C. and under a pressure of 7 to 260 Pa, a nitrogen atom content in the oxynitride film has a distribution such that the maximum value Ns of the nitrogen atom content in the oxynitride film at a surface of the oxynitride film opposite a surface facing the substrate is 10 to 40 atomic percent, and the maximum value Nb of the nitrogen atom content in the oxynitride film at the surface facing the substrate side is 0 to 10 atomic percent, the ratio Ns/Nb is 2 or more, and the oxynitride film has an electrical film thickness from 1.0 to 2.5 nm.

8. A process according to claim 7, wherein the plasma is generated using microwave irradiation by using a plane antenna member having a plurality of slots.

* * * * *